US008240490B2

(12) United States Patent
Malekmadani (10) Patent No.: US 8,240,490 B2
(45) Date of Patent: Aug. 14, 2012

(54) ANTI-VIBRATION RACK, MOUNT AND FEET FOR COMPUTER SERVERS

(76) Inventor: Mohammad Ghassem Malekmadani, Palo Alto, CA (US)

( * ) Notice: Subject to any disclaimer, the term of this patent is extended or adjusted under 35 U.S.C. 154(b) by 348 days.

(21) Appl. No.: 12/476,239

(22) Filed: Jun. 1, 2009

(65) Prior Publication Data
US 2010/0000950 A1     Jan. 7, 2010

Related U.S. Application Data

(63) Continuation-in-part of application No. 11/653,414, filed on Jan. 11, 2007.

(51) Int. Cl.
*A47B 43/00* (2006.01)
(52) U.S. Cl. ........................................................ 211/188
(58) Field of Classification Search ................. 211/188, 211/26, 187, 186, 189, 41.18; 361/808, 679.48; 206/454
See application file for complete search history.

(56) References Cited

U.S. PATENT DOCUMENTS

| | | | | |
|---|---|---|---|---|
| 3,868,986 A * | 3/1975 | Olsen | ............................ | 164/7.1 |
| 4,022,327 A * | 5/1977 | Anderson | ........................ | 211/74 |
| 4,204,096 A | 5/1980 | Barcus et al. | | |
| 4,391,377 A * | 7/1983 | Ziaylek, Jr. | ................ | 211/85.18 |
| 4,525,771 A * | 6/1985 | Hanseler et al. | .............. | 361/786 |
| 4,560,136 A | 12/1985 | Basore | | |
| 4,592,610 A * | 6/1986 | Bowls | ........................... | 439/377 |
| 4,596,195 A | 6/1986 | Wenger | | |
| 4,683,520 A * | 7/1987 | Grassens et al. | .............. | 361/825 |
| 4,687,173 A | 8/1987 | Genna | | |
| 5,379,904 A * | 1/1995 | Brown | .......................... | 211/85.8 |
| 5,393,226 A * | 2/1995 | Groom | .......................... | 432/258 |
| 5,524,776 A * | 6/1996 | Hall et al. | ..................... | 211/151 |
| 5,706,946 A * | 1/1998 | Kakizaki et al. | .............. | 206/454 |
| 5,997,117 A | 12/1999 | Krietzman | | |
| 6,039,190 A * | 3/2000 | Clausen | .......................... | 211/40 |
| 6,056,381 A | 5/2000 | Turner | | |
| 6,186,344 B1 * | 2/2001 | Park et al. | ..................... | 211/41.1 |
| 6,560,107 B1 * | 5/2003 | Beck et al. | ..................... | 361/699 |
| 6,695,149 B1 * | 2/2004 | Cote et al. | ....................... | 211/26 |
| 6,786,562 B2 * | 9/2004 | Obrock et al. | ................ | 312/408 |
| 6,801,418 B1 | 10/2004 | Epstein | | |
| 6,984,974 B2 * | 1/2006 | Liken et al. | .............. | 324/750.19 |
| 7,165,685 B2 * | 1/2007 | Byrne et al. | ..................... | 211/26 |
| 7,234,254 B2 * | 6/2007 | Schmidt | .......................... | 40/310 |
| 7,341,151 B2 * | 3/2008 | Takagi | .......................... | 206/454 |
| 7,500,564 B2 * | 3/2009 | Choi | ............................. | 206/711 |
| 7,931,145 B2 * | 4/2011 | Gao et al. | ...................... | 206/454 |
| 2002/0097556 A1 | 7/2002 | Lee | | |
| 2005/0281999 A1 | 12/2005 | Hofmann et al. | | |
| 2006/0032826 A1 * | 2/2006 | Liu | ............................ | 211/41.18 |
| 2006/0067060 A1 | 3/2006 | Zimlin | | |
| 2007/0187348 A1 * | 8/2007 | Malekmadani | ............... | 211/186 |
| 2007/0278170 A1 * | 12/2007 | Wiebe | ........................... | 211/187 |
| 2008/0006596 A1 * | 1/2008 | Palmeri | ......................... | 211/189 |
| 2008/0193247 A1 * | 8/2008 | Zupancich et al. | ............. | 410/92 |
| 2009/0034224 A1 * | 2/2009 | Wiedemeier et al. | ......... | 361/808 |
| 2010/0000950 A1 * | 1/2010 | Malekmadani | ................. | 211/26 |
| 2011/0149508 A1 * | 6/2011 | Malekmadani | ........... | 361/679.48 |

* cited by examiner

*Primary Examiner* — Sarah Purol
(74) *Attorney, Agent, or Firm* — Kolisch Hartwell, P.C.

(57) ABSTRACT

A novel apparatus and system for dampening vibrational forces from servers and electronic components is provided. According to one embodiment, the present invention generally provides a rack for dampening vibration including: a top panel, a bottom panel, and two side panels positioned between the top panel and the bottom panel where the top panel, the bottom panel and the two side panels are fiberglass re-enforced plastics; the side panels have grooves along the height of the side panels that extend the full depth of the side panels designed to enable shelves or servers with attached mounts to be positioned along the side panels and pulled in and out of the rack.

24 Claims, 6 Drawing Sheets

ANTI-VIBRATION RACK, MOUNT AND FEET FOR COMPUTER SERVERS

CROSS-REFERENCE TO RELATED APPLICATIONS

This application is a continuation-in-part pursuant to 37 C.F.R. §1.53(b) of U.S. patent application Ser. No. 11/653,414, filed Jan. 11, 2007, which claims priority from U.S. Provisional Application Ser. No. 60/761,219 filed Jan. 11, 2006, both of which are incorporated herein by reference in their entirety for all purposes.

FIELD OF THE INVENTION

The invention relates generally to shelf and rack systems for servers and electronic components and more particularly to apparatus and methods for minimize vibration from servers and electronic components.

BACKGROUND

Data centers and server racks are extremely noisy places. The noise resulting from vibration can be significant. Multiple sources of vibration contribute to the vibration level of server racks in data centers including but not limited to Computer Room Air Conditioners (CRACS) for building and racks, chillers, building, rack, and server transformers, building/rack Un-interruptible Power Supplies (UPS) and rack/server/Hard Disc Drives (HDD) and cooling fans. These are all very noisy and collectively create a very complex and high level of vibration at wide ranges of frequency. Vibration levels at data centers, server racks and servers vary and typically can be 1 g or more.

Existing server racks are fabricated without vibration dissipating measures. Generally made from steel sheet metal, existing rack structures actually magnify vibration rather mitigating it.

Hard Disc Drives are very sensitive to vibration. When looking for a file to read, the head is moving inward or outward as the disc is spinning, in order to locate the beginning of the file. Vibration makes this task more difficult as the head searches for the file location on the disc. HDD manufacturers have implemented vibration sensors in the HDDs to sense vibration and pause I/O operation in presence of high vibration. Input/Output (I/O) becomes much faster and more efficient as vibration is suppressed. Generally, write operations take longer than read operations and are more sensitive to vibration. Many server/computer operations are I/O—intensive workloads, e.g. On-line transaction processing (OLTP) applications, video streaming, web serving, finance applications, etc.

Vibration at wide ranges of frequencies interferes with HDD operation and in some cases causes the corresponding server or computer to shut down. As a result, there is a need for anti-vibration measures at various frequencies to dissipate vibration in servers allowing HDDs to perform much more efficiently.

The relationship between an arbitrary vibration force F and the resulting motion X of a multiple degree of freedom structure can be presented as: $MX''+CX'+KX=F$ Where X is displacement (motion), X' velocity, X" is acceleration, M represents mass, C damping and K stiffness of the structure. Stiffness and damping properties of materials and structures vary with operational frequencies.

Embodiments of the novel anti vibration rack optimize structural stiffness and damping to mitigate vibration at all operating frequencies in servers and data centers.

The selection of materials may also influence the performance of a system. Materials that aid in minimizing vibration exist. An example of such is carbon fiber composites.

Carbon fiber generally refers to carbon filament thread, or to felt or woven cloth made from those carbon filaments. The term carbon fiber is also used to mean any composite material made with carbon filament, such a material is sometimes referred to as graphite-reinforced plastic.

Each carbon filament is made out of long, thin filaments of carbon sometimes transferred to graphite. A common method of making carbon filaments is the oxidation and thermal pyrolysis of polyacrylonitrile (PAN), a polymer used in the creation of many synthetic materials. Like all polymers, polyacrylonitrile molecules are long chains, which are aligned in the process of drawing continuous filaments. When heated in the correct conditions, these chains bond side-to-side (ladder polymers), forming narrow graphene sheets which eventually merge to form a single, jelly roll-shaped or round filament. The result is usually 93-95% carbon. Lower-quality fiber can be manufactured using pitch or rayon as the precursor instead of PAN. The carbon can become further enhanced, as high modulus or high strength carbon, by heat treatment processes. Carbon heated in the range of 1500-2000° C. (carbonization) exhibits the highest tensile strength (820,000 psi or 5,650 MPa or 5,650 N/mm$^2$), while carbon fiber heated from 2500 to 3000° C. (graphitizing) exhibits a higher modulus of elasticity (77,000,000 psi or 531 GPa or 531 kN/mm$^2$).

There are several categories of carbon fibers: standard modulus (250 GPa), intermediate modulus (300 GPa), and high modulus (>300 GPa). The tensile strength of different yarn types varies between 2000 and 7000 MPa. The density of carbon fiber is 1750 kg/m3.

Precursors for carbon fibers are PAN, rayon and pitch. In the past rayon was more used as a precursor and still is for certain specialized applications such as rockets and specific aerospace applications. Carbon fiber filament yarns are used in several processing techniques: the direct uses are for prepregging, filament winding, pultrusion, weaving, braiding and the like.

The filaments are stranded into a yarn. Carbon fiber yarn is rated by the linear density (weight per unit length=1 g/1000 m=tex) or by number of filaments per yarn count, in thousands. For example 200 tex for 3,000 filaments of carbon fiber is 3 times as strong as 1,000 carbon fibers, but is also 3 times as heavy. This thread can then be used to weave a carbon fiber filament fabric or cloth. The appearance of this fabric generally depends on the linear density of the yarn and the weave chosen. Carbon fiber is naturally a glossy black but colored carbon fiber is also available.

Carbon fiber may be used to reinforce composite materials, particularly the class of materials known as carbon fiber reinforced plastics. This class of materials is often used in demanding mechanical applications. Carbon fiber's unique properties such as high stiffness, high strength, high damping, low density, and corrosion resistance are ideal for demanding applications. Carbon fiber/epoxy composites have mechanical properties such as the stiffness and strength of steel, and damping of 10 times more than aluminum at 30% lower density.

While non-polymer materials can also be used as the matrix for carbon fibers, due to the formation of metal carbides (i.e., water-soluble AlC), bad wetting by some metals, and corrosion considerations, carbon is used less frequently in metal matrix composite applications.

Vibration may interfere with the operation of HDDs, cooling fans and other server components resulting in reduction of performance and increase in energy consumption. Therefore there is a need for a means to minimize or eliminate vibration. In order to address the vibration, embodiments of the present invention provide for a novel anti-vibration rack (AVR) that dissipates vibration at wide frequency ranges. For example, the novel AVR may dissipate vibration from 10 Hz to several thousand and perhaps in several hundred thousand Hz. The frequency range of interest in HDD operation is preferably from 50 Hz to 2,000 Hz. Testing of various embodiments of the novel server AVR verify the effect of its anti-vibration technologies on servers' performance and energy consumption. Embodiments of the novel AVR dissipate vibration passively, effectively eliminating vibration in all interested frequency ranges.

SUMMARY

One embodiment of the present invention provides an apparatus for dampening vibration including: a top panel, a bottom panel, and two side panels positioned between the top panel and the bottom panel where the top panel, the bottom panel and the two side panels are fiberglass re-enforced plastics; the side panels have grooves that extend the full depth of the side panels and; and at least one shelf support assembly composed of fiber re-enforced plastic having an elongated tab along each side designed to mate with the grooves on the side panels.

Another embodiment of the present invention provides an apparatus for dampening vibration in a metal server rack including: a shelf support assembly having a shelf plate preferably made from re-enforced plastic, and two strip bars of polyurethane and carbon fiber attached by fasteners to the side of the shelf plate where the carbon fiber strip bar rides on wall grooves of the metal server rack and sit in place on the grooves when the shelf slides all the way in the cabinet.

In another embodiment of the present invention an apparatus for dampening vibration is provided including a server side mount where the server side mount comprises four mounts, two on each side of the server and the mounts are supported on a server cabinet's grooves. The four side mounts are "L" shaped brackets attached to the side of the server via fasteners.

Other and further features and advantages of the present invention will be apparent from the following descriptions of the various embodiments. It will be understood by one of ordinary skill in the art that the following embodiments are provided for illustrative and exemplary purposes only, and that numerous combinations and modification of the elements of the various embodiments of the present invention are possible.

BRIEF DESCRIPTION OF THE DRAWING

Non-limiting and non-exhaustive embodiments of the present invention are described with reference to the following drawings. In the drawings, like reference numerals refer to like parts throughout the various figures unless otherwise specified.

For a better understanding of embodiments of the present invention, reference is made to the following Detailed Description, which is to be read in association with the accompanying drawings, wherein.

DETAILED DESCRIPTION OF PREFERRED EMBODIMENTS

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as systems, or devices. The following detailed description should not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an,"and "the" include plural references. The meaning of "in" includes "in" and "on."

Embodiments of the invention provide anti-vibration methods implemented in novel anti-vibration racks (AVR) that may be used in data and server centers and in existing server racks and servers. In various embodiments the AVRs are designed to dissipate vibration. Embodiments of the invention providing for anti-vibration measures implemented on existing racks include novel shelf assemblies, novel anti-vibration server mount attachments and novel anti-vibration server feet support.

The anti-vibration mounts herein are defined as general spring-dashpot modules to support either the server directly and attach to the server rack as mounts or to be used as server feet supporting the server on the rack shelf.

The novel anti-vibration modules take a variety of forms including rubber-springs, air dashpots or any other variation of spring-dashpot offering proper stiffness and damping to dissipate vibration. The embodiments described herein are anti-vibration modules made from elastomer (rubber like material) and fiber re-enforced plastics. The elastomer may be polyurethane, and fiber re-enforced plastics may be carbon fiber/epoxy composites and fiberglass re-enforced plastics.

The anti-vibration modules described herein, dissipate vibration in all operating frequency ranges passively or actively. Active vibration dissipation modules are comprised of vibration sensors to sense vibration force and frequency and then automatically or manually adjust its stiffness and damping to counter it. In embodiments including air dashpots, the air pressure is adjusted to accomplish this task. A preferred embodiment as described in this disclosure is a passive anti-vibration rack. The use of materials like polyurethane, carbon fiber and fiberglass in the novel design presented herein provide vibration dissipation in wide ranges of frequencies. While not explicitly shown in the embodiments, it is contemplated with in the scope of the embodiment of the present invention that air dashpots may be incorporated as an additional vibration dissipation means, complimentary vibration dissipation means or alternatively as an exclusive means.

Figure 1:
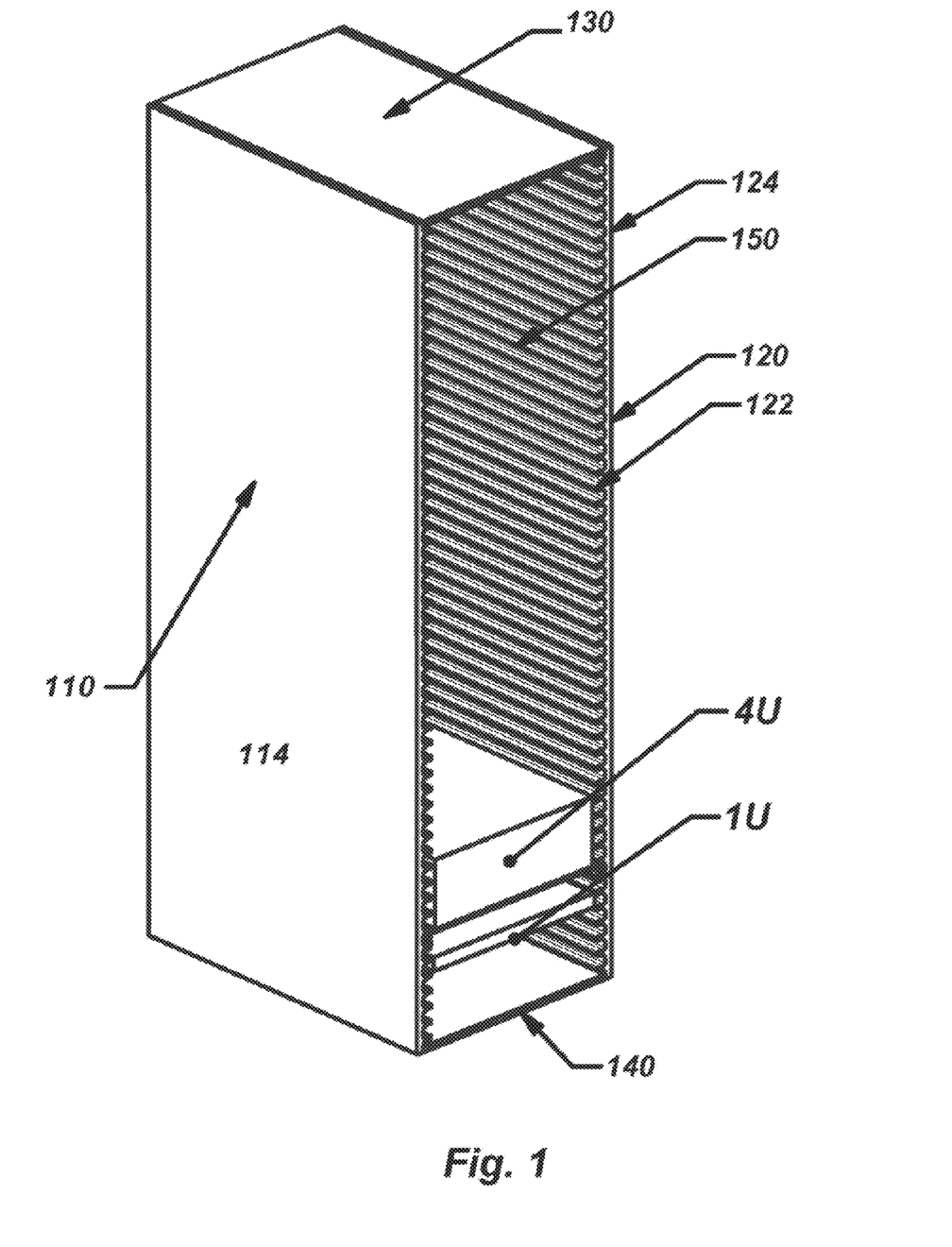
FIG. 1 is a perspective view of an exemplar server rack system in accordance with an embodiment of the present invention.

FIG. 1 depicts a perspective view of an AVR 100. The AVR 100 may preferably be designed and manufactured using aerospace structural and isolation principles. The AVR 100 is preferably constructed primarily from materials that assist in minimizing vibration and other interference. Carbon fiber composites are one such material and are one of the optimal materials for these purposes. Various acrylics are also suitable for such purpose. In contrast, glass and metals are less desirable for damping and minimizing the effects of vibration, oscillation and the like.

Carbon fiber composite materials offer an excellent damping/stiffness combination. When a structure, like an AVR is designed properly, it dissipates vibration the most effectively as it utilizes stiffness, damping and mass. That dissipation may be maximized by selecting a material well suited for the purpose, a carbon fiber composite is such a material.

The AVR 100 has a first side panel 110 and a second side panel 120. The AVR 100 also has an upper panel 130 and a lower panel 140. The first side panel 110, second side panel 120, upper panel 130 and lower panel 140 form a box-like structure having an open face 150. The upper panel 130, lower panel 140 and side panels 110, 120 may be constructed from materials as described above. In another embodiment some or all of the panels may be constructed from alternative materials. For example in one embodiment, some or all of the panels are plastic with or without fiberglass or carbon fiber reinforcement. In another embodiment, some or all of the panels are plastic with foam cores. In embodiments including foam cores, the panels may be molded with internal foam cores that are injected or comprised from sheets of foam. Alternatively, in embodiments including foam cores, the panels may be constructed as laminate layer with foam between the layers throughout or at the median of the layers. Preferably the upper, lower and side panels are $1/8$" to 1" thick. However, in some instances it may be preferable to have thicker panels for example because of the strength needed to support the weight of the components contained in the cabinet.

Figure 6A:
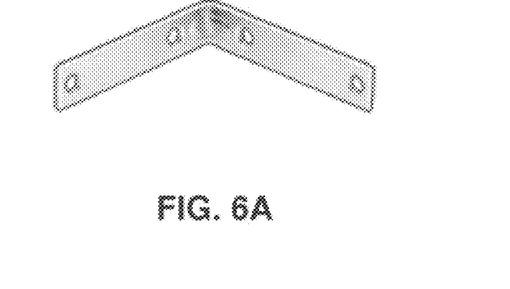
FIGS. 6A-6C are front views of exemplar brackets in accordance with embodiments of the present invention.
Figure 6B:
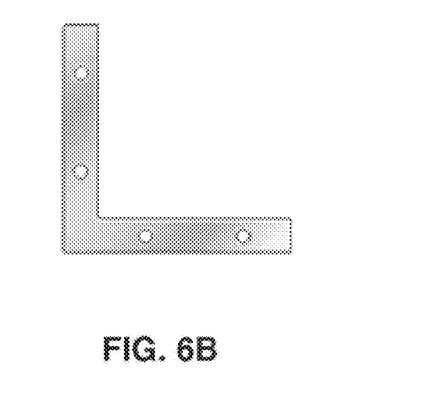
Figure 6C:
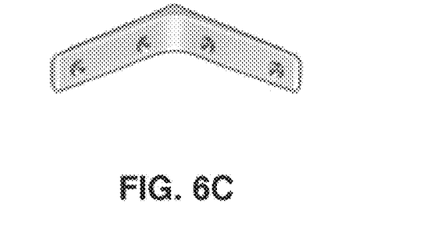

The first side panel 110 and the second side panel 120 each have an inner surface 112, 122 and an outer surface 114, 124. The outer surface 114, 124 may be textured or smooth; the inner surface 112, 122 is configured with grooves to support servers or other electronic equipment. Although depicted as a box like structure, this is not intended to be a limitation on the present invention. It is contemplated that an open shelving style system could also be constructed; in addition, it is contemplated that within a box like structure, additional side panels could be installed so that multiple sub-boxes exist within a larger box. In one embodiment, angled brackets may be attached at the inner or outer corners of the box like cabinet structure to strengthen the AVR. In another embodiment, angle brackets may be attached to the corner faces of the box like cabinet structure. FIGS. 6A-6C depict exemplar brackets. FIG. 6A illustrates a corner "L" bracket that may be fastened on the inside or outside surface of the AVR. FIG. 6B show a face mount "L" bracket configured to be mounted on the outside of the AVR. FIG. 6C depicts an inside corner bracket. The brackets shown are illustrative only and not intended to be a limitation on the size, or shape of bracket that may be utilized to further strengthen the AVR. Furthermore, the brackets may limit movement of the AVR thereby providing further strengthening. The brackets may be comprised of any commercially available material including but not limited to metal.

Figure 2:
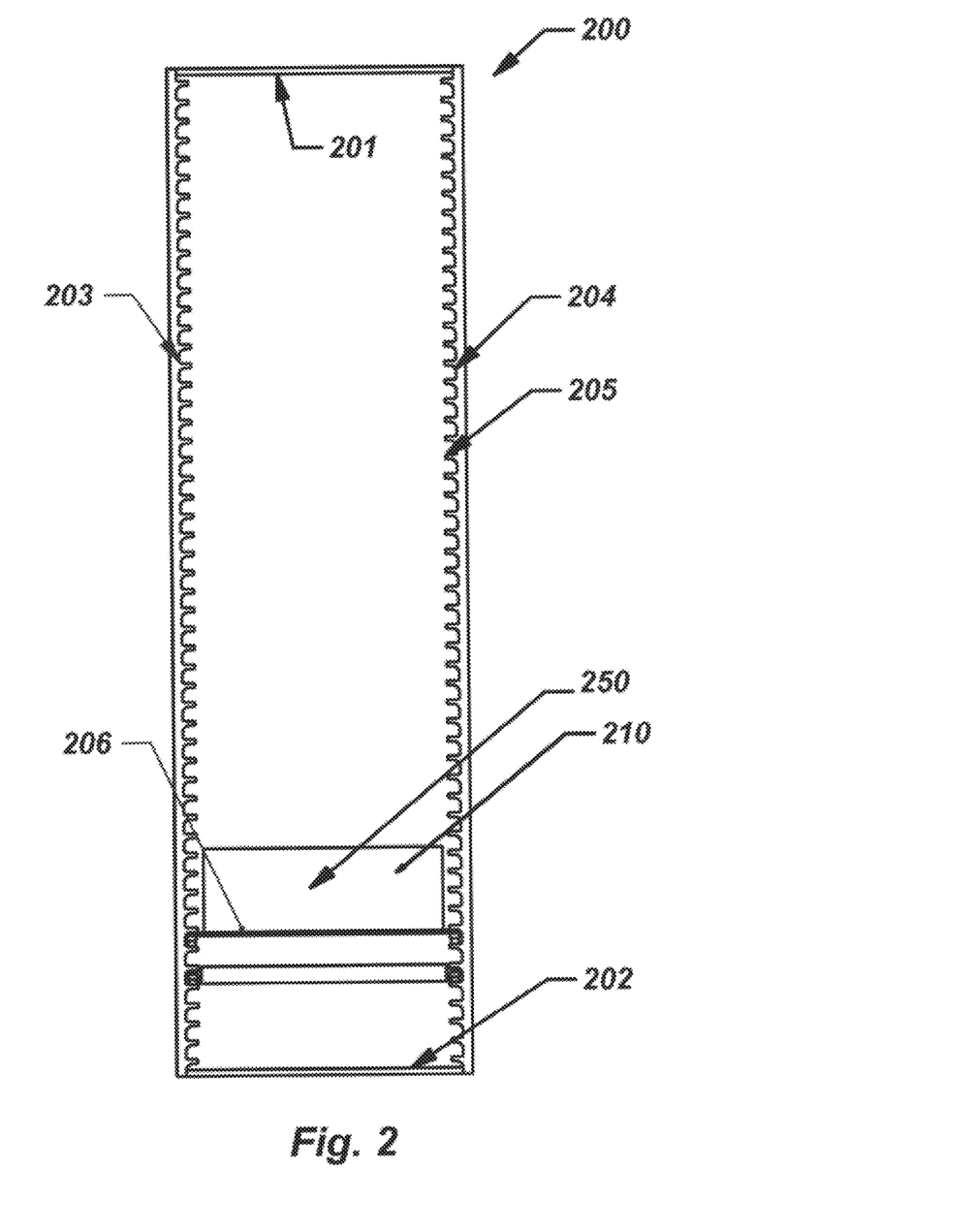
FIG. 2 is a front view of an exemplar rack system in accordance with another embodiment of the present invention.

FIG. 2 is a front view on an AVR 200 according to an embodiment of the present invention. The AVR 200 described herein is designed to dissipate vibration passively in various frequencies, which interfere with operation of HDDs, cooling fans and other server components. The AVR 200 consists of a rack cabinet similar to that described in conjunction with FIG. 1. The AVR 200 may be constructed in various sizes and configuration so that the shelves and/or server mounts are capable of supporting various size servers. The configuration shown herein is not intended to be a limitation on the embodiments of the present invention. AVR 200 also referred to herein as a rack cabinet, consists of four sections: two side panels 203 and 204, an upper panel 201 and a lower panel 202. The side panels 201 and 202 have drawer type grooves 205 or other track systems for shelves. Other track systems that may be used include but are not limited to bars, retracting arms, ball bearing systems, peg systems, and fixed shelves.

A server 250 may be placed on a server shelf support assembly 206 and can then be slid in and out of an AVR. The server shelf assembly 206 may be constructed from any variety of materials. For example, carbon fiber composite or fiberglass composite materials offer an excellent damping/stiffness combination. The shelf assembly system 206 comprises a shelf plate 210, and two strip bars, one of polyurethane, i.e. sorbothane, and one of carbon fiber attached by fasteners (not shown), or other mechanical means, to the side of the shelf plate 210. The shelf plate 210 is of such a thickness that it is sufficient to support the weight of the server or other electronic component. The shelf plate 210 may be 0.1" to 1" inch thick. Preferably the shelf 210 is approximately 0.25" thick. In one embodiment, a 1" thick acrylic material shelf without fiber re-enforcement is implemented. The shelf plate 210 may be constructed from carbon fiber or fiberglass or any other suitable material. Fiberglass is preferably used for cost savings. In one embodiment having multiple shelves, one or more shelves are carbon fiber while the other one or more shelves are fiberglass. The carbon fiber shelves are preferably constructed using lamination techniques or molding techniques. The shelves may be constructed by molding or extrusion process or in the form of multiple plys of sheets of carbon fiber, i.e. laminate construction as disclosed above. Alternatively, the shelf plate 210 may be constructed from medium-density fiberboard ("MDF") or MDF with a carbon fiber veneer. Furthermore, the shelf plate 210 may also be constructed from acrylics or similar plastic materials such as polymethyl methacrylate (also known as "acrylic glass" and "Plexiglas®"), the synthetic polymer of methyl methacrylate, or an acrylic with a carbon fiber veneer. When a carbon fiber veneer is used, the veneer is $10/1000$ to $199/1000$ inch thick and preferably $30/1000$ to $35/1000$ inch thick. The carbon fiber veneer described above is a multi layer carbon fiber skin (i.e. a laminate process) which is bonded to all surfaces (top, bottom and sides) of the MDF or acrylic to create the shelf. Carbon fiber (CF) veneer has sheets of CF fabric or unidirectional CF or CF mat pressed and cured to make a solid sheet. The fibers are generally placed along the veneer plane. The carbon fiber blocks used in vibration mounts (described below) are preferably made from laminated sheets of CF placed and cut at optimal angles, such that oblique angles are created between the plans of the sheets, to maximize its stiffness, strength and damping characteristics. Preferably the sheets are constructed from axisymetric solid laminated carbon fiber epoxy composite laminates with an oblique angle between the plane of laminate and top plane of the shelf to provide optimal stiffness and damping. More preferably the angle is about 20 degrees. The carbon fiber blocks may also be made from chopped carbon fiber epoxy using a molding or extruding process, in addition other similar methods maybe used to fabricate a mount. Regardless of fabrication method, the carbon fiber is preferably cut in the preferred optimal angle. In addition, ional metal wire may be added to the carbon fiber fabric to enhance shielding capability. Although depicted as having only a single shelf assembly 206, such is not intended to be a limitation and the AVR may have any number of shelves based on the height/size of the AVR.

The server shelf assembly 206 is supported on the grooves 205. The groves 205 are located on the inner surface of the side panels 203, 204 and are parallel to the shelf assembly rack 206. The grooves 205 preferably extend the full depth of the rack cabinet 200. However, it is not required that the shelf 210 and/or the groove 205 extend the entire depth of the rack cabinet 200. Preferably the groove 205 will run the length of the shelf assembly 206 so that the shelf assembly 206 is supported along its entire side length. The grooves 205 may be evenly spaced or unevenly spaced along the inner surface of the side panels 203, 204.

In one embodiment, the preferred method of fabrication of the rack cabinet 200 is molded fiberglass re-enforced plastics. The rack cabinet 200 may also be made with other materials and methods to reduce cost.

Figure 3:
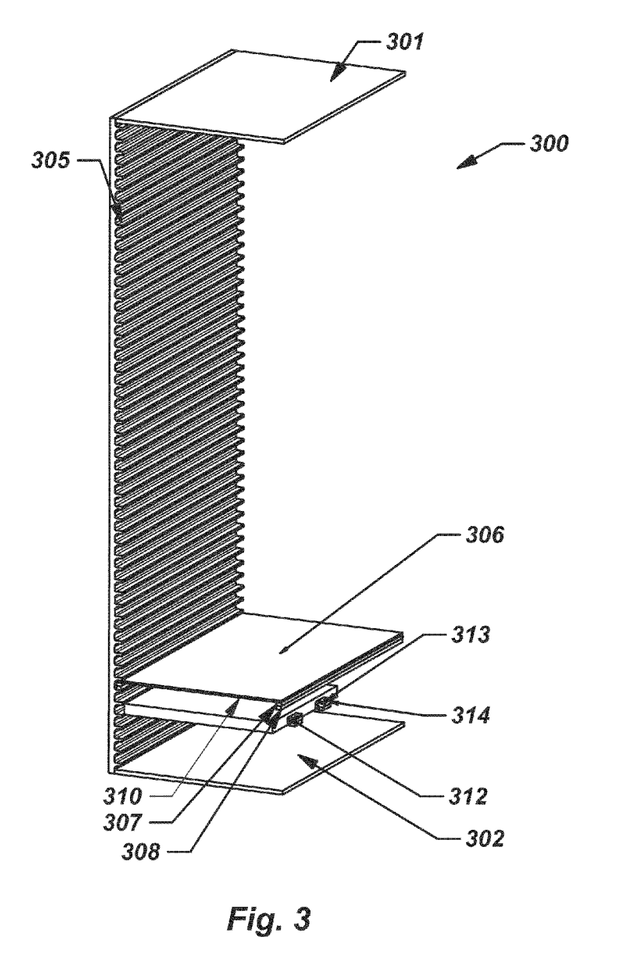
FIG. 3 is a perspective view of an exemplar server rack in accordance with an embodiment of the present invention.

FIG. 3 depicts a cutaway perspective view of an AVR 300. The AVR 300 depicts a server 314 mounted directly in the rack cabinet 300 without a shelf plate supporting it and a shelf support assembly 310. Although depicted as having one shelf support assembly 310 and one direct mount server, this is not intended to be a limitation on the embodiments of the present invention, any combination of shelf assemblies and direct mounts may be utilized and are contemplated with in the scope of the present invention. The AVR 300 has an upper panel 301 and a lower panel 302

Figure 5:
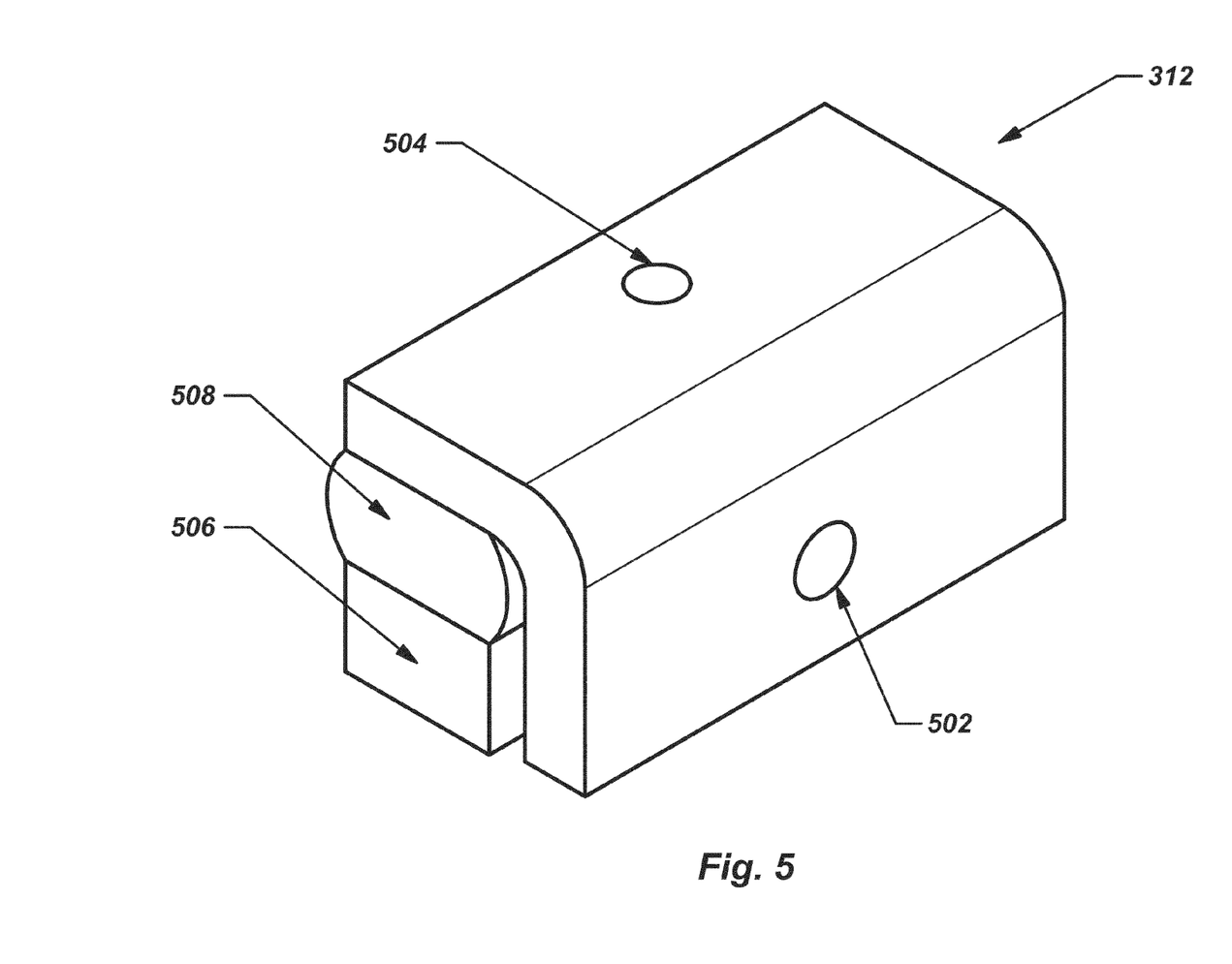
FIG. 5 is a perspective view of an anti-vibration mount in accordance with an embodiment of the present invention.

The server 313 which is mounted directly in the rack cabinet 300 has anti-vibration mounts 312 attached to the sides of the server. FIG. 5 depicts an exemplary anti-vibration mount 312. The anti-vibration mounts 312 may be comprised from elastomers, carbon fiber, or fiberglass, or any other material which has mechanical properties such that vibrational forces are absorbed. The anti-vibration mounts 312 have an inner surface and an outer surface. Preferably the mounts 312 are constructed as "L" brackets. However, this geometry is not intended to be a limitation on the shape of the anti-vibration mount.

The anti-vibration mounts 312 are configured with fastener holes 502, 504 to allow the mount to be attached to the sides of a server and compression blocks comprised of a carbon fiber block 506 and a polyurethane block 508. Although the compression blocks are depicted as being positioned on the inner surface of the bracket, this is not intended to be a limitation on the embodiments of the present invention, the compression blocks may also be positioned on the outer surface. Further, although described as being comprised of two blocks, the compression block may be comprised of a single block of any material capable of dissipating vibration or more than two blocks. The carbon fiber blocks dissipate vibration in mid and high frequency ranges while the polyurethane block dissipate vibration in low frequency range, generally below 200 Hz. The anti-vibration mount 312 is attached to the sides of a server via screws, using built-in screw holes on their sides for rack attachment. The polyurethane block 508 is compressed to its optimum compression which is preferably 10-15% by positioning it between the carbon fiber block 506 and the bracket. The anti-vibration mounts 312 are designed to ride and rest on the rack cabinet's 300 side grooves 305. The anti-vibration mounts 312 absorb the vibration from the server and allow it to be dissipated through the anti-vibration mounts 312 and the AVR 300.

In another embodiment, the mounts 312 are configured to be secured to the base of a component, i.e., as "feet", when the component is positioned on a metal shelf of a metal rack or shelf support assembly of an AVR to further reduce vibration.

The shelf assembly 310 is preferably implemented to support larger and/or more critical servers for the optimum vibration dissipation while the server mounts 312, 313 generally support smaller and less vibration prone servers. Such preferred configuration is not intended to be a limitation on the embodiments of the present invention. It is contemplated within the scope of the embodiments that the size of the shelves and the mounts may vary to accommodate a variety of component sizes and specifications.

Figure 4:
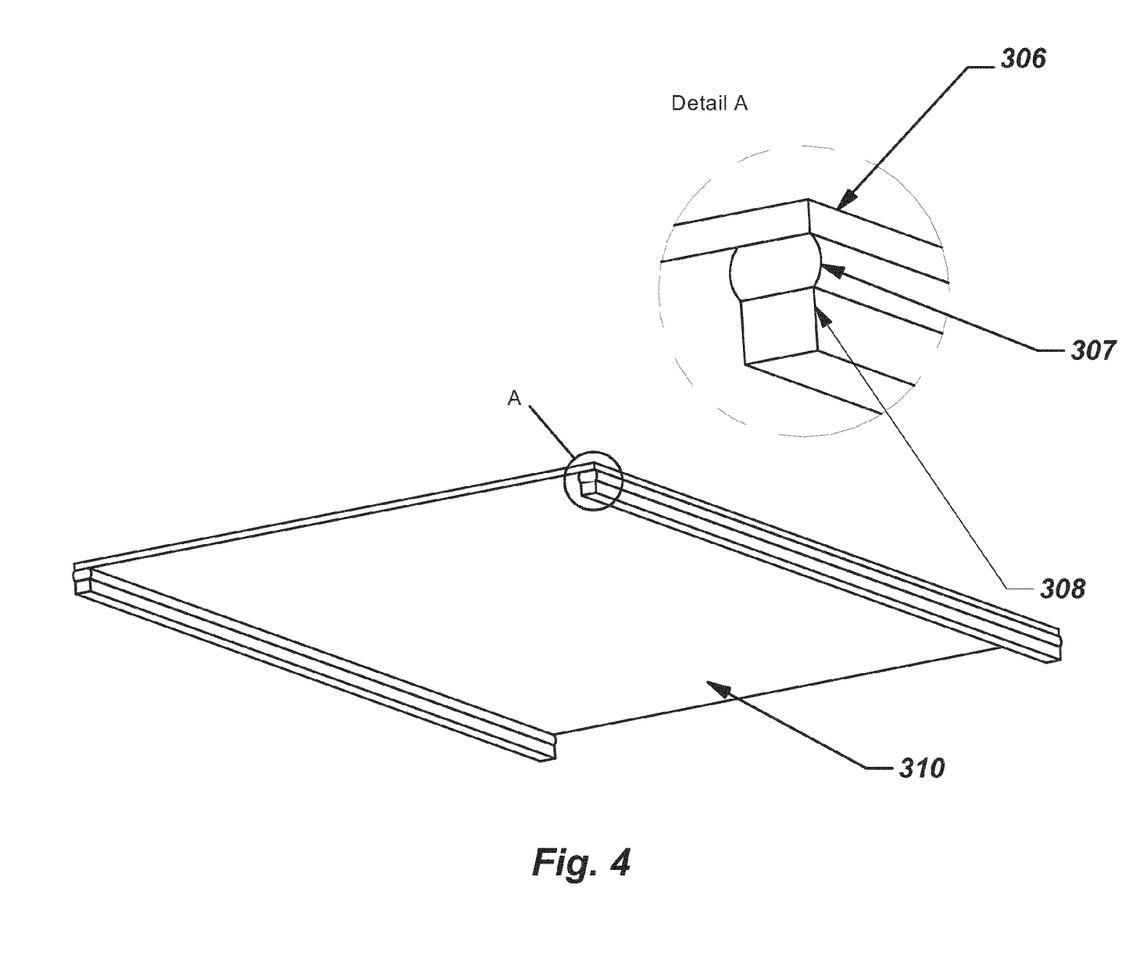
FIG. 4 is a perspective view of a shelf support assembly in accordance with an embodiment of the present invention.

The shelf support assembly 306 is shown in detail in FIG. 4. The shelf support assembly 306 is comprised of a shelf plate 310 preferably made from re-enforced plastic like fiberglass re-enforced plastics, and two strip bars one of polyurethane, i.e. sorbothane, 307 and one of carbon fiber 308 attached by fasteners (not shown), or other mechanical means, to the side of the shelf plate. The polyurethane bar 307 is compressed to its optimum compression which is preferably 10-15% by positioning the polyurethane bar 307 between the carbon fiber bar 308 and the shelf plate fastener. The two side carbon fiber bars 308 are positioned and configured such that the carbon fiber bars 308 slide on the grooves 305 and sit in place on the grooves 305 when the shelf assembly 306 is positioned in the cabinet.

The server side mount system consists preferably of at least four mounts 312, more preferably, two mounts 312 are located on either side of the server such that the mounts 312 are able to slide along and be supported on the cabinet's grooves 305. In one embodiment, each side mount 312 consists of an "L" shape bracket 313 attached to the side of the server via a fastener, a polyurethane block/carbon fiber 314 that is positioned and compressed between the horizontal side of the "L" bracket 313 and a carbon fiber block 315 via a bolt or other mechanical fastener. The carbon fiber blocks 314 slides and rests on the wall grooves 305 of the cabinet. Although described as an "L" shaped bracket, such geometry is not intended to be a limitation on the embodiments of the present invention. The mounts 312 could be other shapes or configurations so long as the mount is capable of mating with the grooves 305. Similarly, the shelf 310 or the shelf assembly 306 may have a cross-section other that rectangular and the geometry of the grooves 305 may be adapted to accommodate such variations.

Optionally, front and back doors are provided to create an enclosure for the cabinet 300. In such a configuration, the doors attach to the side panels (not shown) via hinges and latches or other mechanical means. The doors may be solid, with meshed opening allowing for air circulation, or other venting means.

While the embodiment depicts grooves to support the shelf assembly systems and/or mounts attached to the servers or other electronic equipment, this is not intended to be a limitation on the embodiments of the present invention. Other means of attaching the shelf assembly system and side mounts to the rack cabinet are contemplated within the scope of the embodiments. Non-limiting alternative support means include, drawer closers with or without soft close mechanisms or other retraction control means, shelf brackets, direct attachment to the inner surface of the side panels; latching mechanisms; pegs or other hanging systems)

Embodiments of the present invention also include methods for reducing vibration of a component in a rack having a support means on either side of the rack inner side panels. The method includes positioning the component on a carbon fiber shelf having at least two opposite sides; attaching at least one compression block to each of the at least two opposite sides of the carbon fiber shelf; and placing the carbon fiber shelf with the component on the carbon fiber shelf in the rack such that each of the at least one compression block mates with the support means located on either side of the rack.

As noted previously the forgoing descriptions of the specific embodiments are presented for purposes of illustration and description. They are not intended to be exhaustive or to limit the invention to the precise forms disclosed and obviously many modifications and variations are possible in view of the above teachings. The embodiments were chosen and described in order to explain the principles of the invention and its practical applications, to thereby enable those skilled in the art to best utilize the invention and various embodiments thereof as suited to the particular use contemplated. It is intended that the scope of the invention be defined by the claims and their equivalents.

The invention claimed is:

1. An apparatus for dampening vibration of a shelf plate or an electronic component, the apparatus comprising:
    a top panel;
    a bottom panel;
    two side panels positioned between the top panel and the bottom panel wherein the top panel, the bottom panel and the two side panels are comprised of fiber re-enforced plastics;
    the two side panels having multiple support means along the height of the side panels that extend along the depth of the side panels; and
    at least two compression blocks attached to opposite side surfaces of a shelf plate or an electronic component, each of the at least two compression blocks configured to slidinqly attach to one of the multiple support means such that the compression block rests on the support means.

2. The apparatus of claim 1, further comprising, at least eight angled brackets wherein one of each of the at least eight angled brackets is attached to the corner faces created by the two side panels being positioned between the top panel and the bottom panel.

3. The apparatus of claim 1, wherein the supports means is an elongated groove.

4. The apparatus of claim 1, wherein the at least two compression blocks are comprised of at least two polyurethane strip bars and at least two carbon fiber strip bars.

5. The apparatus of claim 4, wherein the carbon fiber strips are comprised of laminated carbon fiber.

6. The apparatus of claim 5, wherein the laminate is cut in an oblique angle to the face of the strip.

7. The apparatus of claim 4, wherein the carbon fiber strips are comprised of chopped carbon fiber.

8. The apparatus of claim 1, wherein the at least two compression blocks are comprised of at least two polyurethane strip bars and at least two fiberglass strip bars.

9. The apparatus of claim 4, further comprising a shelf support assembly comprising:
    a shelf plate having an upper surface, a lower surface, and two opposite side surfaces-wherein the at least two compression blocks are attached to the opposite side surfaces of the shelf plate and the shelf plate is comprised of re-enforced plastic;
    one of the at least two polyurethane strip bars is attached each of the two opposite side surfaces; and
    one of the at least two carbon fiber strip bars attached to each of the at least two polyurethane strip bars; wherein the carbon fiber strip bars rest and travels on the support means.

10. The apparatus of claim 1, wherein the two side panels further comprise foam cores.

11. The apparatus of claim 1, wherein the top panel, bottom panel and two side panels further comprise foam cores.

12. The apparatus of claim 1, wherein the top panel, bottom panel and two aside panels are less than 1 inch in thickness.

13. An apparatus for dampening vibration in a metal server rack having side panels including support means, the apparatus comprising:
    a shelf support assembly comprising:
    a shelf plate having an upper surface, a lower surface, and two opposite side surfaces wherein the shelf plate is comprised of re-enforced plastic; and
    at least two compression bars, wherein at least one compression bar is fastened to each of the two opposite side surfaces, the at least two compression bars configured to slidinglv attach to a metal server rack having side panels including support means.

14. The apparatus of claim 13, wherein the at least two compression bars comprise:
    at least two polyurethane strip bars; and
    at least two carbon fiber strip bars.

15. The apparatus of claim 13, wherein each one of the at least two compression bars are constructed by attaching one of the at least two polyurethane strip bars to each of the two opposite side surfaces and attaching one of the at least two carbon fiber strip bars to each of the at least two polyurethane strip bars.

16. A mount for dampening vibration of an electronic component supported in a rack having side panels including support means; the mount comprising:
    a bracket having an inner surface and an outer surface;
    at least two fastener holes in the bracket including a first fastener hole and a second fastener hole; and
    a compression block attached to the bracket and configured to slidingly attach to a rack having side panels including support means;
    wherein the compression block is fixed to the bracket via the first fastener hole and an electronic component is fixed to the bracket via the second faster hole such that the compression block is disposed between the electronic component and the rack side panels.

17. The mount of claim 16, wherein the compression block comprises:
    a carbon fiber block; and
    a polyurethane block.

18. The mount of claim 17, wherein the polyurethane block is fastened adjacent to the inner surface of the bracket, and the carbon fiber block is fastened to the polyurethane block.

19. The mount of claim 17, wherein the polyurethane block is fastened adjacent to the outer surface of the bracket, and the carbon fiber block is fastened to the polyurethane block.

20. The mount of claim 16, wherein the bracket is shaped as an "L".

21. The mount of claim 16, wherein the second fastener hold is configured for fastening the bracket to a side of the electronic component.

22. The mount of claim 16, wherein the second fastener hold is configured for fastening the bracket to a base of the electronic component.

23. An apparatus for dampening vibration comprising:
a top panel;
a bottom panel; and
two side panels positioned between the top panel and the bottom panel wherein the top panel, the bottom panel and the two side panels consist of plastic and include foam cores.

24. The apparatus of claim 23, wherein the plastic is a fiber re-enforced.

* * * * *